United States Patent [19]

Sawada et al.

[11] Patent Number: 5,751,027
[45] Date of Patent: May 12, 1998

[54] FIELD EFFECT SEMICONDUCTOR DEVICE WITH A LOW-NOISE DRIFT LAYER AND A HIGH-POWER DRIFT LAYER

[75] Inventors: Minoru Sawada, Yawata; Yasoo Harada, Hirakata, both of Japan

[73] Assignee: Sanyo Electric Co., Ltd., Osaka-fu, Japan

[21] Appl. No.: 555,846

[22] Filed: Nov. 10, 1995

[30] Foreign Application Priority Data

Nov. 10, 1994  [JP]  Japan ................... 6-276151

[51] Int. Cl.$^6$ ............ H01L 31/0328; H01L 31/0336
[52] U.S. Cl. ............................ 257/192; 257/194
[58] Field of Search .......................... 257/192, 194

[56] References Cited

U.S. PATENT DOCUMENTS 5,373,186  12/1994  Schubert et al. .................. 257/192
5,404,032  4/1995  Sawada et al. .................... 257/192

OTHER PUBLICATIONS

Sawada et al; "New Planar Two-Mode Channel . . . "; Appl. Phys. vol. 34 pp. 1168-1171, Feb. 1995.

Jpn. J. Appl. Phys. vol. 34(1995)pp. 1168-1171 Part 1, No. 2B, Feb. 1995 (Received Aug. 31, 1994).

Primary Examiner—Wael Fahmy
Attorney, Agent, or Firm—Darby & Darby

[57] ABSTRACT

A field effect semiconductor device includes an undoped $In_{0.2}Ga_{0.8}As$ first low-noise drift layer, an undoped $In_xGa_{1-x}As$ (x=0.2–0) second low-noise drift layer and an n-type GaAs high-power drift layer in this order. The high-power drift layer includes a first high-power drift layer doped with n-type carrier at high concentration and a second high-power drift layer doped with n-type carrier at low concentration.

19 Claims, 7 Drawing Sheets

FIELD EFFECT SEMICONDUCTOR DEVICE WITH A LOW-NOISE DRIFT LAYER AND A HIGH-POWER DRIFT LAYER

CROSS-REFERENCE TO RELATED APPLICATION

This application is related to copending application Ser. No. 08/400,651, filed Mar. 8, 1995, commonly assigned with present invention.

BACKGROUND OF THE INVENTION

1. Field of the Invention

The present invention relates to field effect semiconductor devices, and particularly to a field effect semiconductor device having both the low-noise performance and the high-power performance.

2. Description of the Background Art

Recently, as the demand for the microwave communication systems, such as the satellite broadcasting and the microwave communication, increases, miniaturization of communication devices is required. In such communication systems, the high-power performance characteristic is required when transmitting and the low-noise performance characteristic is required when receiving. Accordingly, a field effect semiconductor device having both the low-noise performance and the high-power performance has been developed recently. This field effect semiconductor device is called a TMT (Two Mode Channel FET) element.

Figure 5:
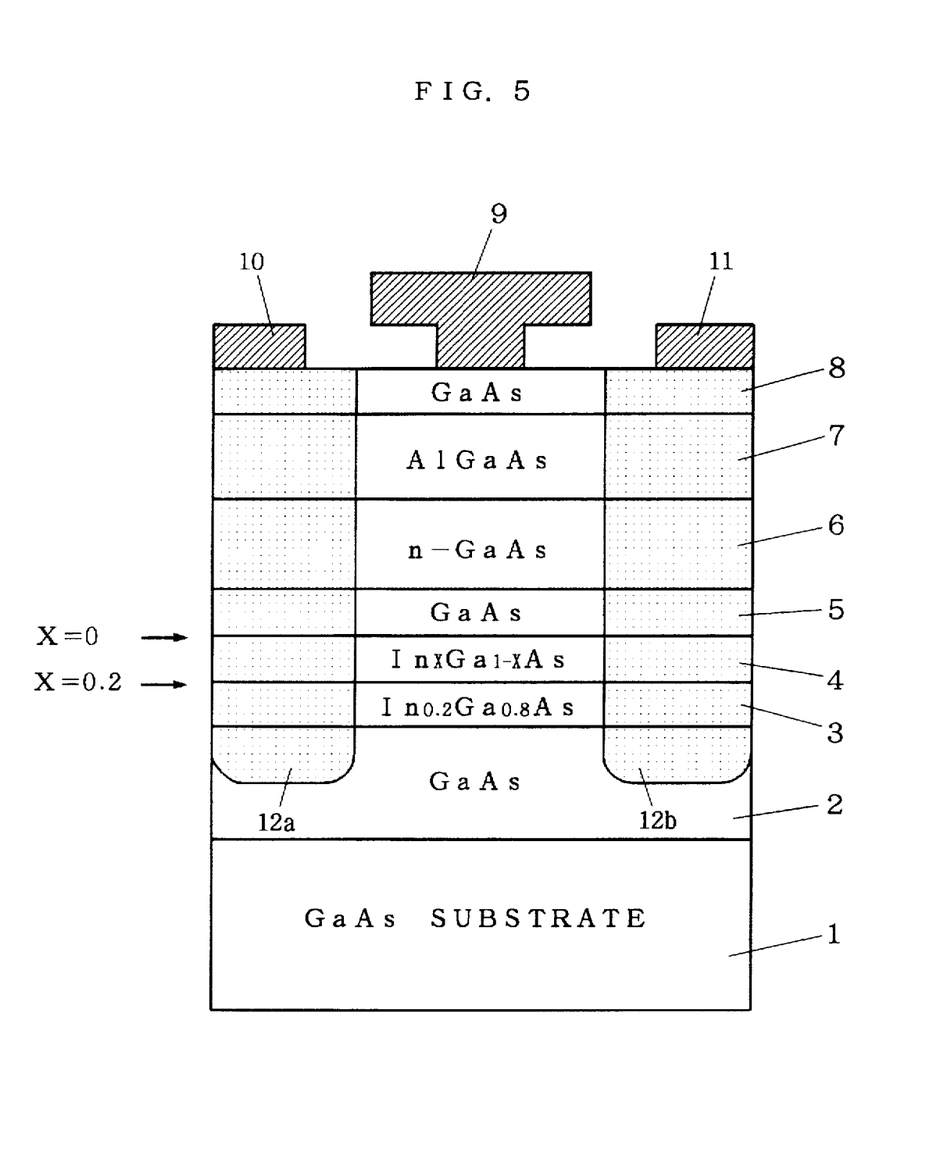
FIG. 5 is a schematic sectional view of a conventional TMT element.

FIG. 5 is a schematic sectional view showing structure of a conventional TMT element. In FIG. 5, an undoped GaAs buffer layer 2, an undoped $In_{0.2}Ga_{0.8}As$ first low-noise drift layer 3 and an undoped $In_xGa_{1-x}As$ second low-noise drift layer 4 are formed in order on a GaAs semi-insulating semiconductor substrate 1. The composition ratio x of In in the second low-noise drift layer 4 decreases in a graded manner from 0.2 to 0, upward from the interface with the first low-noise drift layer 3.

An undoped GaAs impurity diffusion preventing layer 5, an n-type GaAs high-power drift layer 6 with high carrier concentration, an undoped AlGaAs barrier layer 7 and an undoped GaAs protection layer 8 are formed in order on the second low-noise drift layer 4.

A gate electrode 9 in Schottky contact with the protection layer 8 is formed in the center on the protection layer 8 and a source electrode 10 and a drain electrode 11 in ohmic contact with the protection layer 8 are formed on both sides of the gate electrode 9, respectively. Highly electroconductive regions 12a and 12b into which Si is ion-implanted are formed under the source electrode 10 and the drain electrode 11.

Figure 6:
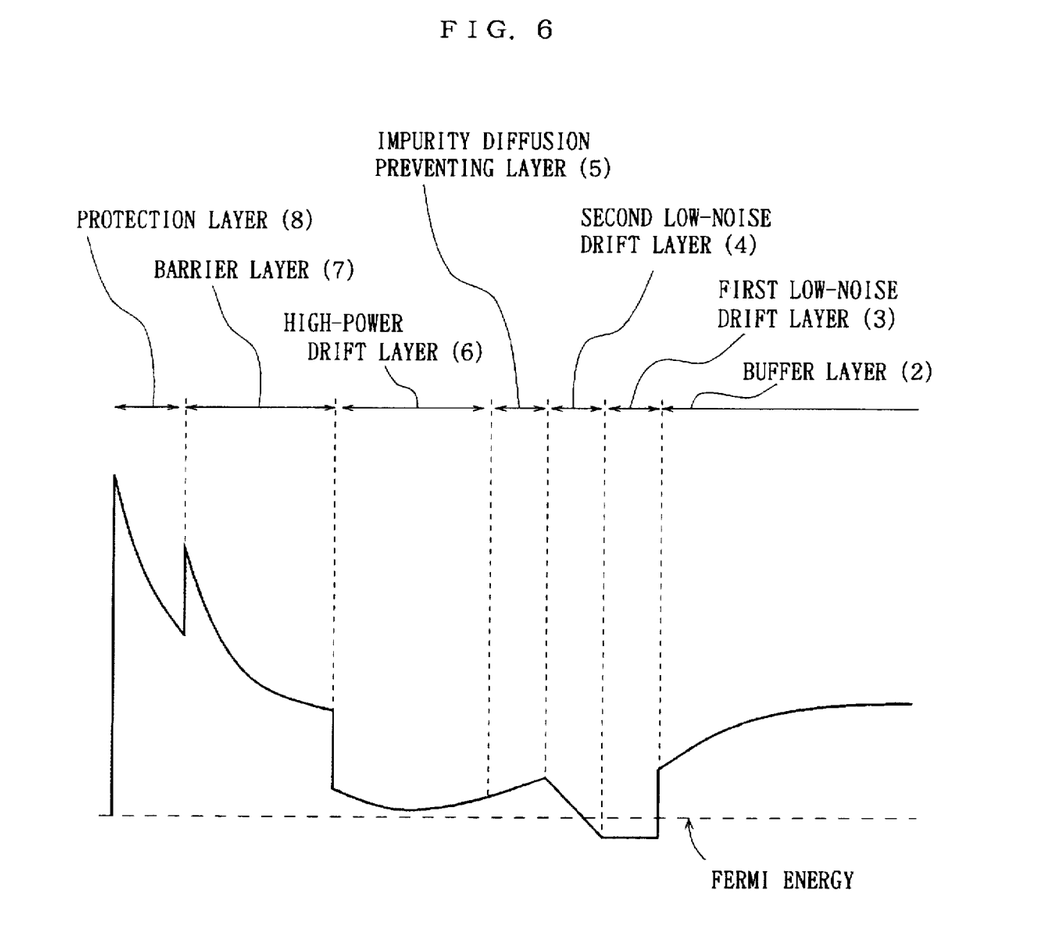
FIG. 6 is a schematic diagram of a conduction energy band in the TMT element.

FIG. 6 shows a schematic diagram of a conduction energy band right under the gate electrode 9 in the TMT element in FIG. 5.

The electron affinity (which corresponds to an energy difference from the lower end of the conduction band to the vacuum level) of the first low-noise drift layer 3 is larger than the electron affinity of the buffer layer 2. The second low-noise drift layer 4 has a forbidden bandgap which increases in a graded manner from the interface with the first low-noise drift layer 3 to the interface with the impurity diffusion preventing layer 5, where the electron affinity in the interface with the first low-noise drift layer 3 is not more than the electron affinity of the first low-noise drift layer 3, and the electron affinity in the interface with the impurity diffusion preventing layer 5 is not less than the electron affinity of the impurity diffusion preventing layer 5. The electron affinity of the high-power drift layer 6 is almost equal to the electron affinity of the impurity diffusion preventing layer 5, the electron affinity of the barrier layer 7 is not more than the electron affinity of the high-power drift layer 6 in the interface with the high-power drift layer 6, and the electron affinity of the protection layer 8 is not less than the electron affinity of the barrier layer 7 in the interface with the barrier layer 7.

When the gate potential is deep, a depletion layer extends downward and electrons supplied from the high-power drift layer 6 drift mainly in the first low-noise drift layer 3 and the second low-noise drift layer 4. In this case, since electrons are well confined in the quantum-well in the first low-noise drift layer 3 and the second low-noise drift layer 4, they are not much affected by impurities in the highly doped high-power drift layer 6, and thus super-low-noise characteristic is obtained. On the other hand, when the gate potential is shallow, a depletion layer shrinks and electrons drift mainly in the high-power drift layer 6. Accordingly, as the highly doped high-power drift layer 6 serves as a channel, high and plateau-shaped transconductance is obtained and the high-power characteristic is thus obtained.

Figure 7:
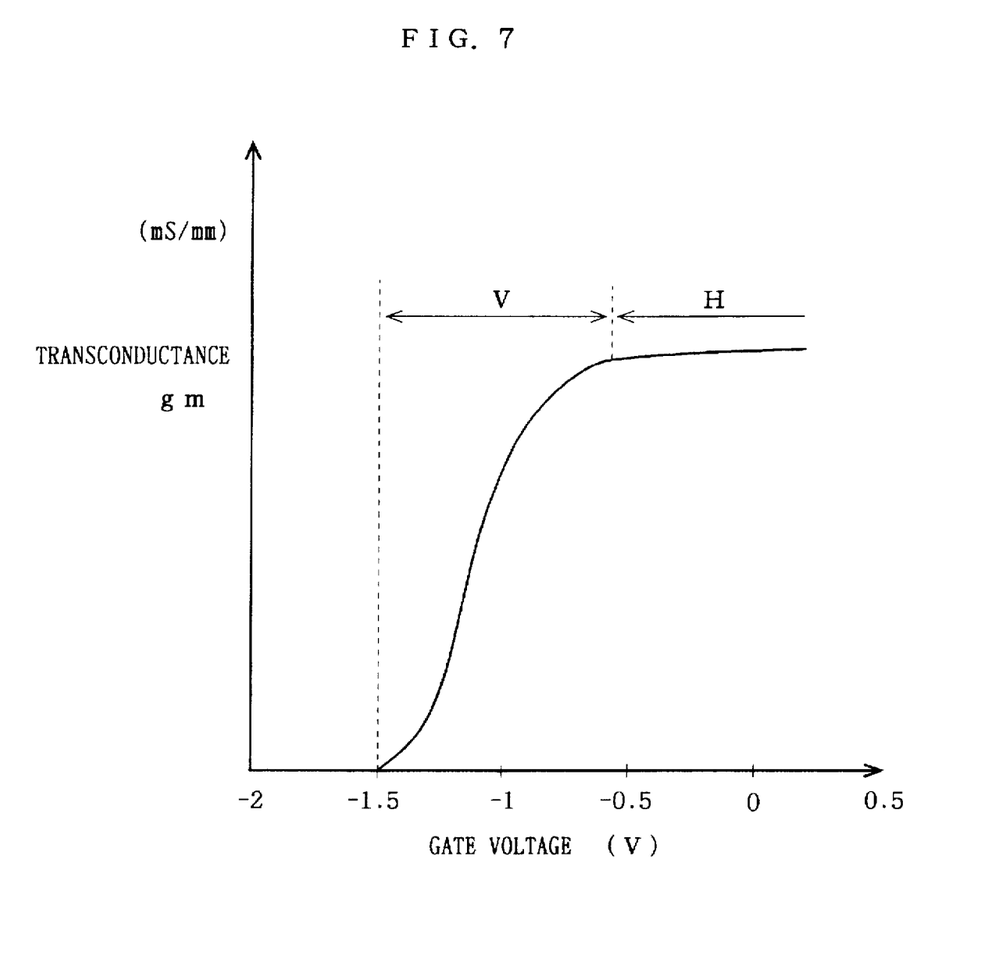
FIG. 7 is a diagram showing the transconductance—gate voltage characteristic of the conventional TMT element.

FIG. 7 shows the transconductance—gate voltage characteristic in the conventional TMT element described above. Here, the transconductance gm is a ratio of a change in the drain current with respect to a change in the gate voltage, which represents the amplification degree of signal. As shown in FIG. 7, the transconductance gm rises from the lower gate voltage side and becomes almost constant as the gate voltage increases.

To reduce power consumption of communication devices, if the drive voltage (source drain voltage) of the TMT element is constant, it is necessary to reduce the drain current at an operation point, and for this purpose, the transconductance characteristic must be flat in a region where the drain current is low, i.e. in a region where the gate voltage is low.

In the above-described conventional TMT element, however, as shown in FIG. 7, since the rising portion V of the transconductance gm has a certain width and the plateau portion H of the transconductance gm does not extend to the low gate voltage region, the drain current at the operation point can not be decreased so much.

SUMMARY OF THE INVENTION

An object of the present invention is to provide a field effect semiconductor device capable of reduction of power consumption.

Another object of the present invention is to provide a field effect semiconductor device having plateau-shaped transconductance characteristic in a low gate voltage region.

A field effect semiconductor device according to the present invention includes a low-noise drift layer formed of undoped semiconductor in which electrons mainly drift in a low-noise operation mode and a high-power drift layer formed of semiconductor of one conductivity type in which electrons mainly drift in a high-power operation mode, and the high-power drift layer includes a first layer doped with carrier of the one conductivity type at predetermined high concentration and a second layer doped with carrier of the one conductivity type at predetermined concentration lower than the predetermined high concentration.

The first layer may be formed of a monolayer formed by the atomic planar doping.

It is preferred that the sheet carrier concentration of the first layer is not more than twice the sheet carrier concentration of the second layer per 100 Å.

A field effect semiconductor device according to another aspect of the present invention includes an undoped first semiconductor layer, an undoped second semiconductor layer, an undoped third semiconductor layer, a fourth semiconductor layer of one conductivity type, and a fifth semiconductor layer of the one conductivity type or undoped in this order, wherein an electron affinity of the second semiconductor layer is larger than an electron affinity of the first semiconductor layer, the third semiconductor layer has a forbidden bandgap which increases in a graded manner from the second semiconductor layer side to the fourth semiconductor layer side, an electron affinity of the third semiconductor layer is not more than the electron affinity of the second semiconductor layer on its surface on the second semiconductor layer side, and is not less than an electron affinity of the fourth semiconductor layer on its surface on the fourth semiconductor layer side, and an electron affinity of the fifth semiconductor layer is not more than the electron affinity of the fourth semiconductor layer on its surface on the fourth semiconductor layer side, and the fourth semiconductor layer includes a first layer doped with carrier of the one conductivity type at predetermined high concentration and a second layer doped with carrier of the one conductivity type at predetermined concentration lower than the predetermined high concentration.

The first semiconductor layer is a buffer layer, the second semiconductor layer and the third semiconductor layer are a first channel layer in which electrons mainly drift in a low-noise operation, the fourth semiconductor layer is a carrier-supplying and second channel layer in which electrons mainly drift in a high-power operation, and the fifth semiconductor layer is a barrier layer.

The first layer may be formed of a monolayer formed by the atomic planar doping.

It is preferred that the sheet carrier concentration of the first layer is not more than twice the sheet carrier concentration of the second layer per 100 Å.

It is preferred that the field effect semiconductor device further includes an impurity diffusion preventing layer provided between the third semiconductor layer and the fourth semiconductor layer. Then, the impurities in the fourth semiconductor layer are prevented from diffusing into the third semiconductor layer. It is preferred that the impurity diffusion preventing layer has an election affinity substantially equal to that of the fourth semiconductor layer.

The fifth semiconductor layer may include a barrier layer having an electron affinity not more than that of the fourth semiconductor layer on its surface on the fourth semiconductor layer side, and a protection layer having an electron affinity not less than that of the barrier layer on its surface on the barrier layer side.

The field effect semiconductor device may further include first and second highly conductive regions formed spaced apart from each other in a portion extending from the fifth semiconductor layer to at least the fourth semiconductor layer, first and second ohmic electrodes formed on the first and second highly conductive regions, respectively, and a Schottky electrode formed on a region between the first and second highly conductive regions.

The first semiconductor layer may be composed of a GaAs system, the second semiconductor layer and the third semiconductor layer may be composed of an InGaAs system, the fourth semiconductor layer may be composed of a GaAs system, and the fifth semiconductor layer may be composed of an AlGaAs system.

The first semiconductor layer may be composed of two-layer structure of an InAlAs system and an InGaAs system, the second semiconductor layer, the third semiconductor layer and the fourth semiconductor layer may be composed of an InGaAs system and the fifth semiconductor layer may be composed of an InAlAs system.

A field effect semiconductor device according to another aspect of the present invention includes an undoped first semiconductor layer, an undoped second semiconductor layer, a third semiconductor layer of one conductivity type, and a fourth semiconductor layer of the one conductivity type or undoped in this order, wherein the second semiconductor layer has a forbidden bandgap which increases in a graded manner from the first semiconductor layer side to the third semiconductor layer side, an electron affinity of the second semiconductor layer is larger than an electron affinity of the first semiconductor layer on its surface on the first semiconductor layer side and not less than an electron affinity of the third semiconductor layer on its surface on the third semiconductor layer side, and an electron affinity of the fourth semiconductor layer is not more than the electron affinity of the third semiconductor layer on its surface on the third semiconductor layer side, and the third semiconductor layer includes a first layer doped with carrier of the one conductivity type at predetermined high concentration and a second layer doped with carrier of the one conductivity type at predetermined concentration lower than the predetermined high concentration.

The first semiconductor layer is a buffer layer, the second semiconductor layer is a first channel layer in which electrons mainly drift in a low-noise operation, the third semiconductor layer is a carrier-supplying and second channel layer in which electrons mainly drift in a high-power operation, and the fourth semiconductor layer is a barrier layer.

The first layer may be formed of a monolayer formed by the atomic planar doping.

It is preferred that the sheet carrier concentration of the first layer is not more than twice the sheet carrier concentration of the second layer per 100 Å.

The field effect semiconductor device may further include an impurity diffusion preventing layer provided between the second semiconductor layer and the third semiconductor layer. In this case, the impurities in the third semiconductor layer are prevented from diffusing into the second semiconductor layer. It is preferred that the impurity diffusion preventing layer has an electron affinity substantially equal to that of the third semiconductor layer.

The fourth semiconductor layer includes a barrier layer having an electron affinity not more than that of the third semiconductor layer on its surface on the third semiconductor layer side, and a protection layer having an electron affinity not less than that of the barrier layer on its surface on the barrier layer side.

The field effect semiconductor device may further include first and second highly conductive regions formed spaced apart from each other in a portion extending from the fourth semiconductor layer at least to the third semiconductor layer, first and second ohmic electrodes formed on the first and second highly conductive regions, respectively, and a Schottky electrode formed on a region between the first and second highly conductive regions.

A method of manufacturing a field effect semiconductor device according to still another aspect of the present invention includes the steps of forming an undoped buffer layer on a semi-insulating semiconductor substrate; forming on the buffer layer an undoped low-noise drift layer having an electron affinity larger than that of the buffer layer on its surface on the buffer layer side; forming on the low-noise drift layer a first high-power drift layer having an electron affinity not more than that of the low-noise drift layer on its surface on the low-noise drift layer side and doped with carrier of one conductivity type at predetermined high concentration; forming on the first high-power drift layer a second high-power drift layer doped with carrier of the one conductivity type at predetermined concentration lower than the predetermined high concentration; and forming on the second high-power drift layer a barrier layer of the one conductivity type or undoped having an electron affinity not more than that of the second high-power drift layer on its surface on the second high-power drift layer side.

The step of forming the low-noise drift layer may include the step of forming a graded layer having a forbidden bandgap which increases from the buffer layer side toward the first high-power drift layer side in a graded manner.

In the field effect semiconductor device according to the present invention, since the first layer of the high-power drift layer is highly doped with carriers of the one conductivity type, a rise of the transconductance in a low gate voltage region is sharp, and since the second layer of the high-power drift layer is doped with carriers of the one conductivity type at concentration lower than that of the first layer, the value of the transconductance is generally lower and flat. As a result, the transconductance sharply rises in a region with a low gate voltage and the plateau extends to the region with a low gate voltage. Accordingly, the power consumption of the field effect semiconductor device can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
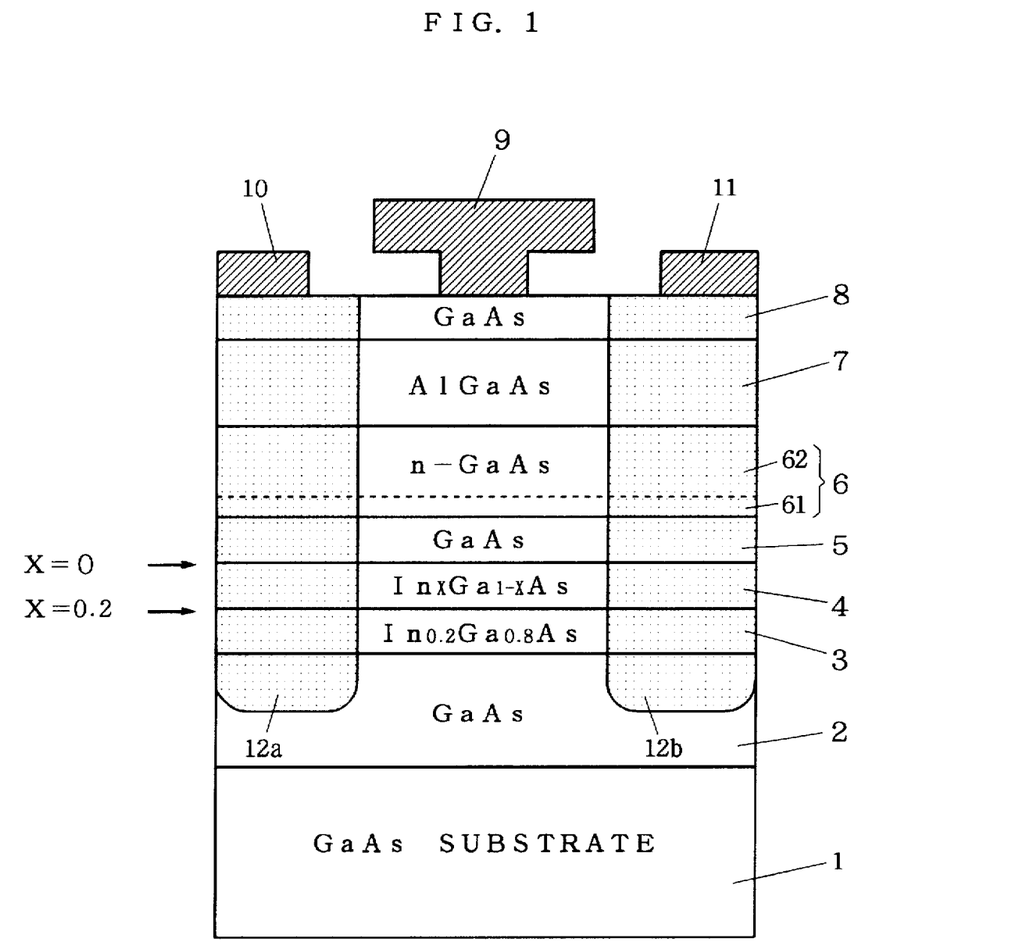
FIG. 1 is a schematic sectional view of a TMT element according to an embodiment of the present invention.

FIG. 1 is a schematic sectional view showing structure of a field effect semiconductor device (referred to as a TMT element, hereinafter) according to an embodiment of the present invention.

In FIG. 1, an undoped GaAs buffer layer 2, an undoped $In_{0.2}Ga_{0.8}As$ first low-noise drift layer 3 and an undoped $In_xGa_{1-x}As$ second low-noise drift layer 4 are formed in order on a GaAs semi-insulating semiconductor substrate 1. The composition ratio x of In in the second low-noise drift layer 4 decreases in a graded manner from 0.2 to 0, upward from the interface with the first low-noise drift layer 3.

An undoped GaAs impurity diffusion preventing layer 5, an n-type GaAs high-power drift layer 6, an undoped AlGaAs barrier layer 7 and an undoped GaAs protection layer 8 are formed in order on the second low-noise drift layer 4. Particularly, the high-power drift layer 6 includes a first high-power drift layer 61 highly doped with Si as n-type impurity and a second high-power drift layer 62 lightly doped with Si as n-type impurity, which are stacked in order.

Formed in the center on the protection layer 8 is a gate electrode 9 in Schottky contact with the protection layer 8 and formed on both sides of the gate electrode 9 are a source electrode 10 and a drain electrode 11 in ohmic contact with the protection layer 8, respectively. Highly electroconductive regions 12a and 12b into which Si is ion-implanted are formed under the source electrode 10 and the drain electrode 11.

The impurity diffusion preventing layer 5 is provided to prevent impurities in the high-power drift layer 6 from diffusing into the second low-noise drift layer 4 in the annealing process after the ion implantation process of the highly conductive regions 12a and 12b.

As described hereinabove, the TMT element of this embodiment has the structure similar to that of the TMT element of FIG. 5 except the high-power drift layer 6.

Figure 2:
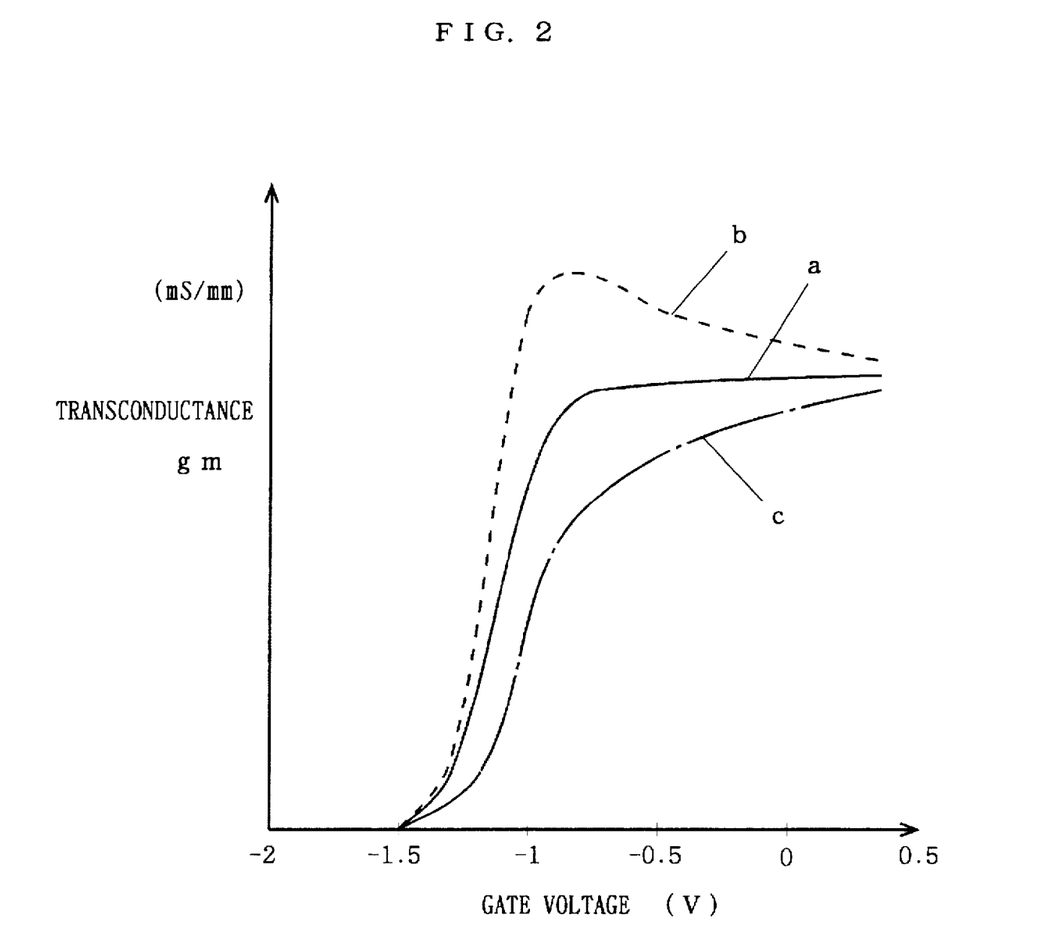
FIG. 2 is a diagram showing the transconductance—gate voltage characteristic of the TMT element of FIG. 1.

FIG. 2 shows the transconductance—gate voltage characteristic of the TMT element of FIG. 1. In FIG. 2, the solid line a shows the transconductance characteristic in the TMT element of FIG. 1, the dashed line b shows the transconductance characteristic of the first high-power drift layer 61 having high carrier concentration, and the one-dotted chain line c shows the transconductance characteristic of the second high-power drift layer 62 having low carrier concentration.

In the TMT element of this embodiment, the characteristic a is obtained by superposing the characteristic b of the first high-power drift layer 61 and the characteristic c of the second high-power drift layer 62. In the characteristic a, the width of the rising portion is small and the plateau portion extends to a region with a low gate voltage. Accordingly, power consumption can be reduced.

Now, TMT elements of a first embodiment, a second embodiment, a first comparison example and a second comparison example were fabricated under the following conditions, and the transconductance—gate voltage characteristics thereof were measured. The comparison example 2 corresponds to the conventional TMT element shown in FIG. 5.

Structure and manufacturing conditions, except those of the high-power drift layer 6, were common in the TMT elements of the first embodiment, the second embodiment, the first comparison example, and the second comparison example. Film thicknesses of the buffer layer 2, the first low-noise drift layer 3, the second low-noise drift layer 4 and the impurity diffusion preventing layer 5 were about 8000 Å, 50 Å, 50 Å and 50 Å, respectively. Film thicknesses of the barrier layer 7 and the protection layer 8 were 250 Å and 50 Å, respectively.

Table 1 shows the carrier concentration and the film thickness of the high-power drift layer 6 in the TMT elements of the first embodiment, the second embodiment, the first comparison example and the second comparison example.

TABLE 1

|  |  | Carrier Concentration | Film Thickness |
|---|---|---|---|
| First Embodiment | First high-power drift layer 61 | $4 \times 10^{18}$ cm$^{-3}$ | 50 Å |
|  | Second high-power drift layer 62 | $1.5 \times 10^{18}$ cm$^{-3}$ | 200 Å |
| Second Embodiment | First high-power drift layer 61 | $2 \times 10^{12}$ cm$^{-2}$ (Sheet carrier) | Atomic planar doped layer 250 Å |
|  | Second high-power drift layer 62 | $1.2 \times 10^{18}$ cm$^{-3}$ |  |
| First Comparison Example | High-power drift layer 6 | $2 \times 10^{18}$ cm$^{-3}$ | 250 Å |
| Second Comparison Example | High-power drift layer 6 | $2.5 \times 10^{18}$ cm$^{-3}$ | 200 Å |

As shown in Table 1, in the TMT element of the first embodiment, the first high-power drift layer 61 has carrier concentration $4 \times 10^{18}$ cm$^{-3}$ and film thickness 50 Å, and the second high-power drift layer 62 has carrier concentration $1.5 \times 10^{18}$ cm$^{-3}$ and film thickness 200 Å.

In the TMT element of the second embodiment, the first high-power drift layer 61 is formed of a monolayer formed by the atomic planar doping, which has sheet carrier concentration $2 \times 10^{12}$ cm$^{-2}$, and the second high-power drift layer 62 has carrier concentration $1.2 \times 10^{18}$ cm$^{-3}$ and film thickness 250 Å.

The sheet carrier concentration of the first high-power drift layer 61 is preferably not more than two times the sheet carrier concentration per 100 Å of the second high-power drift layer 62.

In the TMT element of the first comparison example, the high-power drift layer 6 has carrier concentration $2 \times 10^{18}$ cm$^{-3}$ and film thickness 250 Å, and in the TMT element of the second comparison example, the high-power drift layer 6 has carrier concentration $2.5 \times 10^{18}$ cm$^{-3}$ and film thickness 200 Å.

After continuously growing from the buffer layer 2 to the protection layer 8 by the molecular-beam epitaxy (MBE) method, Si was ion-implanted by $2 \times 10^{13}$ cm$^{-2}$ through a mask with predetermined pattern, and then lamp annealing was applied for 5 seconds at 850° C. to form the electro-conductive regions 12a and 12b. The gate length was 0.5 μm, and the gate width was 1 mm.

Figure 3:
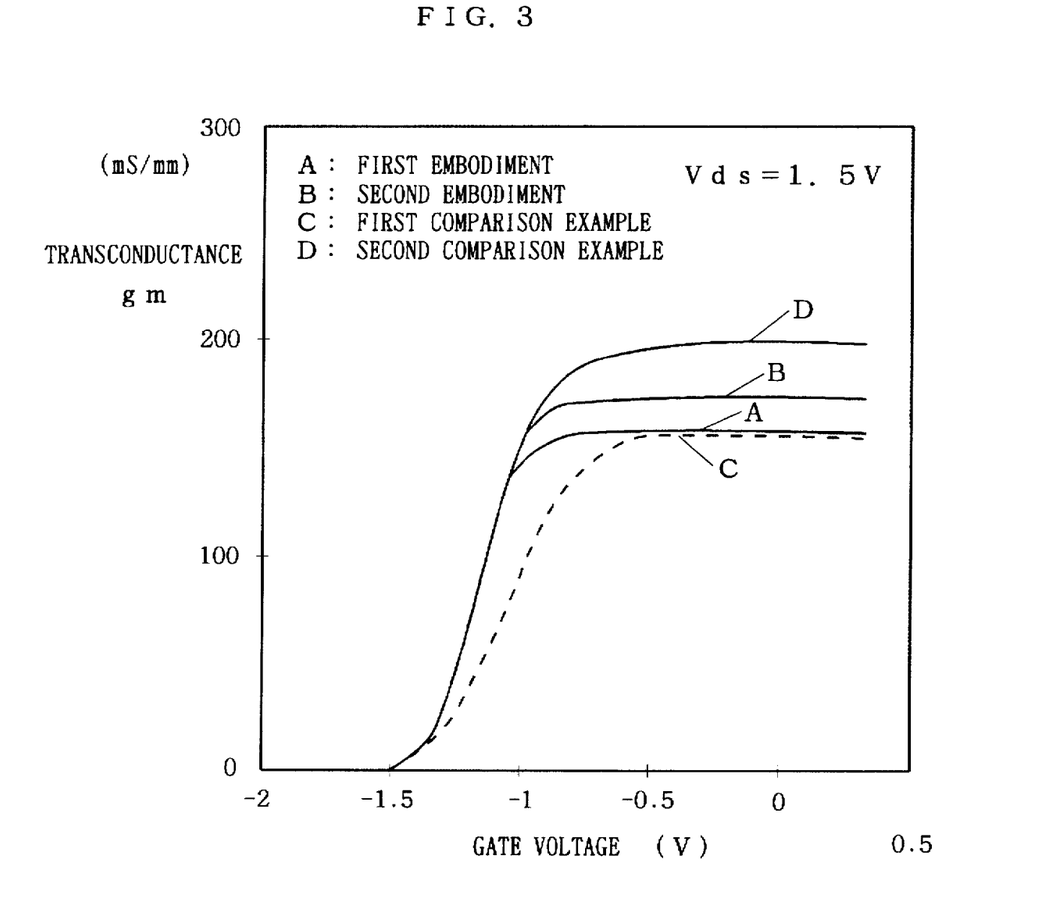
FIG. 3 is a diagram showing the transconductance—gate voltage characteristics of TMT elements of a first embodiment, a second embodiment, a first comparison example and a second comparison example.

FIG. 3 shows the transconductance—gate voltage characteristics in the TMT elements of the first embodiment, the second embodiment, the first comparison example, and the second comparison example. In FIG. 3, A, B, C and D show the transconductance characteristics in the TMT elements in the first embodiment, the second embodiment, the first comparison example, and the second comparison example, respectively. The source-drain voltage $V_{ds}$ is 1.5 V.

In the first comparison example, as the carrier concentration of the high-power drift layer 6 is lower than that in the second comparison example, the value of the transconductance gm is generally decreased, but the rise of the transconductance gm is slow similarly to the second comparison example. On the other hand, in the first and second embodiments, the values of the transconductance gm are generally decreased as compared with the second comparison example and the rise of the transconductance gm is sharp, so that the width of the rising portion is shortened and the plateau portion extends to the low gate voltage side.

As described above, in the TMT elements of the first embodiment and the second embodiment, since the transconductance characteristic is plateau-shaped even in the region where the gate voltage is low as compared with the TMT elements in the first comparison example and the second comparison example, reduction of power consumption can be realized.

Figure 4:
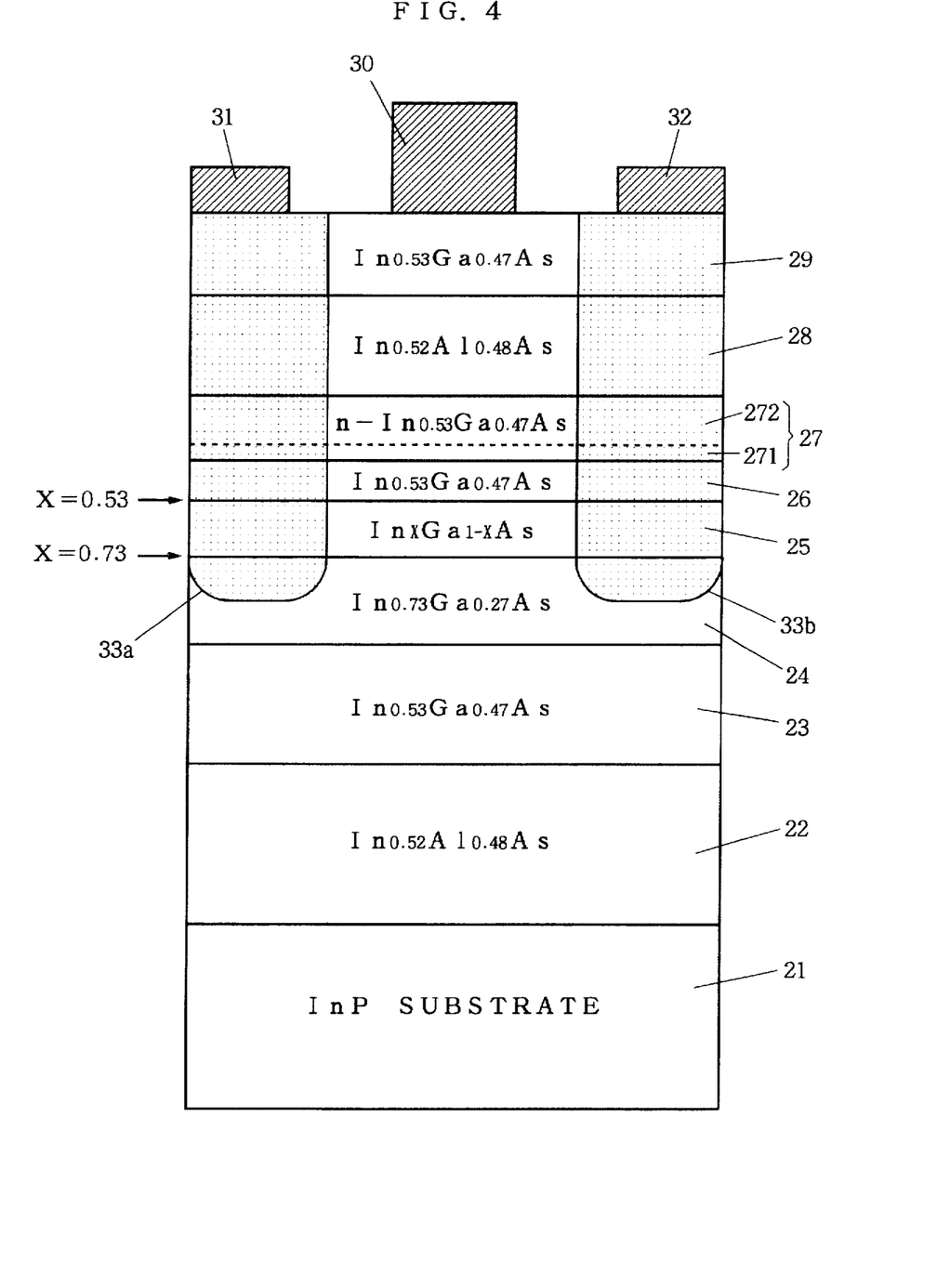
FIG. 4 is a schematic sectional view of a TMT element according to another embodiment of the present invention.

FIG. 4 is a schematic sectional view showing structure of a TMT element according to another embodiment of the present invention.

In FIG. 4, an undoped $In_{0.52}Al_{0.48}As$ buffer layer 22, an undoped $In_{0.53}Ga_{0.47}As$ buffer layer 23, an undoped $In_{0.73}Ga_{0.27}As$ first low-noise drift layer 24 and an undoped $In_xGa_{1-x}As$ second low-noise drift layer 25 are formed in order on an InP semi-insulating semiconductor substrate 21. The composition ratio x of In in the second low-noise drift layer 25 decreases in a graded manner from 0.73 to 0.53, upward from the interface with the first low-noise drift layer 24.

An undoped $In_{0.53}Ga_{0.47}As$ impurity diffusion preventing layer 26, an n-type $In_{0.53}Ga_{0.47}As$ high-power drift layer 27, an undoped $In_{0.52}Al_{0.48}As$ barrier layer 28, and an undoped $In_{0.53}Ga_{0.47}As$ protection layer 29 are formed in order on the second low-noise drift layer 25. Particularly, the high-power drift layer 27 includes a first high-power drift layer 271 highly doped with Si as n-type impurity and a second high-power drift layer 272 lightly doped with Si as n-type impurity, which are stacked in order.

Formed in the center on the protection layer 29 is a gate electrode 30 in Schottky contact with the protection layer 29 and formed on both sides of the gate electrode 30 are a source electrode 31 and a drain electrode 32 in ohmic contact with the protection layer 29, respectively. Highly electro-conductive regions 33a and 33b into which Si is ion-implanted are formed under the source electrode 31 and the drain electrode 32.

Now, TMT elements of a third embodiment, a fourth embodiment, a third comparison example and a fourth comparison example were fabricated under the conditions below, and the transconductance—gate voltage characteristics thereof were measured.

Structure and manufacturing conditions, except those of the high-power drift layer 27, were common in the TMT elements of the third embodiment, the fourth embodiment, the third comparison example, and the fourth comparison example. The film thicknesses of the buffer layer 22, the buffer layer 23, the first low-noise drift layer 24, the second low-noise drift layer 25 and the impurity diffusion preventing layer 26 were 2000 Å, 500 Å, 50 Å, 50 Å, 50 Å, respectively. The film thicknesses of the barrier layer 28 and the protection layer 29 were 250 Å, 50 Å, respectively.

Table 2 shows the carrier concentration and the film thickness of the high-power drift layer 27 in the TMT elements of the third embodiment, the fourth embodiment, the third comparison example and the fourth comparison example.

TABLE 2

|  |  | Carrier Concentration | Film Thickness |
|---|---|---|---|
| Third Embodiment | First high-power drift layer 271 | $4 \times 10^{18}$ cm$^{-3}$ | 50 Å |
|  | Second high-power drift layer 272 | $1.5 \times 10^{18}$ cm$^{-3}$ | 200 Å |

TABLE 2-continued

|  |  | Carrier Concentration | Film Thickness |
|---|---|---|---|
| Fourth Embodiment | First high-power drift layer 271 | $2 \times 10^{12}$ cm$^{-2}$ (Sheet carrier) | Atomic planar doped layer 250 Å |
|  | Second high-power drift layer 272 | $1.2 \times 10^{18}$ cm$^{-3}$ |  |
| Third Comparison Example | High-power drift layer 27 | $2 \times 10^{18}$ cm$^{-3}$ | 250 Å |
| Fourth Comparison Example | High-power drift layer 27 | $2.5 \times 10^{18}$ cm$^{-3}$ | 200 Å |

As shown in Table 2, in the TMT element of the third embodiment, the first high-power drift layer 271 has carrier concentration $4 \times 10^{18}$ cm$^{-3}$ and film thickness 50 Å, and the second high-power drift layer 272 has carrier concentration $1.5 \times 10^{18}$ cm$^{-3}$ and film thickness 200 Å.

In the TMT element of the fourth embodiment, the first high-power drift layer 271 is formed of a monolayer formed by the atomic planar doping, which has the sheet carrier concentration $2 \times 10^{12}$ cm$^{-2}$, and the second high-power drift layer 272 has carrier concentration $1.2 \times 10^{18}$ cm$^{-3}$ and film thickness 250 Å.

The sheet carrier concentration of the first high-power drift layer 271 is preferably not more than two times the sheet carrier concentration per 100 Å of the second high-power drift layer 272.

In the TMT element of the third comparison example, the high-power drift layer 27 has carrier concentration $2 \times 10^{18}$ cm$^{-3}$ and film thickness 250 Å, and in the TMT element of the fourth comparison example, the high-power drift layer 27 has carrier concentration $2.5 \times 10^{18}$ cm$^{-3}$ and film thickness 200 Å.

After continuously growing from the buffer layer 22 to the protection layer 29 by the molecular-beam epitaxy (MBE) method, Si was ion-implanted by $2 \times 10^{13}$ cm$^{-2}$ through a mask with predetermined pattern, and then lamp annealing was applied for 5 seconds at 800° C. to form the conductive regions 33a and 33b.

The transconductance—gate voltage characteristics in the third embodiment, the fourth embodiment, the third comparison example and the fourth comparison example fabricated under the conditions above showed a tendency similar to that of the transconductance—gate voltage characteristics in the first embodiment, the second embodiment, the first comparison example and the second comparison example shown in FIG. 3, respectively. However, the maximum values of the transconductance gm in the third embodiment, the fourth embodiment, the third comparison example and the fourth comparison example were 360 mS/mm, 380 mS/mm, 350 mS/mm and 450 mS/mm, respectively.

As has been described above, in the TMT elements of the third embodiment and the fourth embodiment, as the transconductance characteristic is plateau-shaped even in the region where the gate voltage is low as compared with the TMT elements in the third comparison example and the fourth comparison example, lower power consumption can be realized.

The $In_xGa_{1-x}As$ second low-noise drift layer 4 may be provided directly on the GaAs buffer layer 2 without providing the $In_{0.2}Ga_{0.8}As$ first low-noise drift layer 3 on the GaAs buffer layer 2.

While the invention has been described in detail, the foregoing description is in all aspects illustrative and not restrictive. It is understood that numerous other modifications and variations can be devised without departing from the scope of the invention.

We claim:

1. A field effect semiconductor device, comprising:

a low-noise drift layer including an undoped semiconductor in which electrons mainly drift in a low-noise operation mode and a high-power drift layer including a semiconductor of one conductivity type in which electrons mainly drift in a high-power operation mode, wherein said high-power drift layer comprises a dual layer of a first doped layer doped with a carrier of said one conductivity type at a predetermined high concentration and a second doped layer doped with a carrier of said one conductivity type at a predetermined concentration lower than said predetermined high concentration, and said first doped layer and said second doped layer are formed of the same semiconductor material and having a homojunction with each other, and in said high-power drift layer the layer closest to said low-noise drift layer is formed of said first doped layer.

2. The field effect semiconductor device according to claim 1, wherein said first doped layer includes a monolayer formed by atomic planar doping.

3. The field effect semiconductor device according to claim 2, wherein a sheet carrier concentration of said, first doped layer is equal to or smaller than substantially twice a sheet carrier concentration of said second doped layer per 100 Å.

4. A field effect semiconductor device, comprising:

an undoped first semiconductor layer, an undoped second semiconductor layer, an undoped third semiconductor layer, a fourth semiconductor layer of one conductivity type, and a fifth semiconductor layer of said one conductivity type or undoped in this order, wherein the electron affinity of said second semiconductor layer is larger than the electron affinity of said first semiconductor layer, said third semiconductor layer having a forbidden bandgap which increases in a graded manner from said second semiconductor layer toward said fourth semiconductor layer, the electron affinity of said third semiconductor layer being equal to or smaller than the electron affinity of said second semiconductor layer at its surface in contact with said second semiconductor layer and being equal to or larger than the electron affinity of said fourth semiconductor layer at its surface in contact with said fourth semiconductor layer and the electron affinity of said fifth semiconductor layer being equal to or smaller than the electron affinity of said fourth semiconductor layer at its surface in contact with said fourth semiconductor layer and said fourth semiconductor layer comprising a dual layer of a first doped layer doped with a carrier of said one conductivity type at a predetermined high concentration and a second doped layer doped with a carrier of said one conductivity type at a predetermined concentration lower than said predetermined high concentration and wherein said first doped layer and said second doped layer are formed of the same semiconductor material having a homojunction with each other, and in said fourth semiconductor layer the layer closest to said third semiconductor layer is formed of said first doped layer.

5. The field effect semiconductor device according to claim 4, wherein said first semiconductor layer is a buffer layer, said second semiconductor layer and said third semiconductor layer are each a first channel layer in which electrons mainly drift in a low-noise operation, said fourth semiconductor layer is a carrier-supplying and second channel layer in which electrons mainly drift in a high-power operation, and said fifth semiconductor layer is a barrier layer.

6. The field effect semiconductor device according to claim 4, wherein said first doped layer includes a monolayer formed by atomic planar doping.

7. The field effect semiconductor device according to claim 4, wherein a sheet carrier concentration of said first doped layer is equal to or smaller than substantially twice a sheet carrier concentration of said second doped layer per 100 Å.

8. The field effect semiconductor device according to claim 4, further comprising an impurity diffusion preventing layer provided between said third semiconductor layer and said fourth semiconductor layer.

9. The field effect semiconductor device according to claim 4, wherein said fifth semiconductor layer includes a barrier layer having an electron affinity equal to or smaller than that of said fourth semiconductor layer at its surface in contact with said fourth semiconductor layer and a protection layer having an electron affinity equal to or larger than that of said barrier layer at its surface in contact with said barrier layer.

10. The field effect semiconductor device according to claim 4, further comprising, first and second highly conductive regions formed spaced apart from each other in a portion extending from said fifth semiconductor layer at least to said fourth semiconductor layer, first and second ohmic electrodes formed on said first and second highly conductive regions, respectively, and a Schottky electrode formed on a region between said first and second highly conductive regions.

11. The field effect semiconductor device according to claim 4, wherein said first semiconductor layer is composed of a GaAs system, said second semiconductor layer and said third semiconductor layer are each composed of an InGaAs system, said fourth semiconductor layer is composed of a GaAs system and said fifth semiconductor layer is composed of an AlGaAs system.

12. The field effect semiconductor device according to claim 4, wherein said first semiconductor layer is composed of a two-layer structure of an InAlAs system and an InGaAs system, said second semiconductor layer said third semiconductor layer and said fourth semiconductor layer are each composed of an InGaAs system and said fifth semiconductor layer is composed of an InAlAs system.

13. A field effect semiconductor device, comprising:

an undoped first semiconductor layer, an undoped second semiconductor layer, a third semiconductor layer of one conductivity type, and a fourth semiconductor layer of said one conductivity type or undoped in this order, wherein said second semiconductor layer has a forbidden bandgap which increases in a graded manner from said first semiconductor layer to said third semiconductor layer, the electron affinity of said second semiconductor layer is larger than the electron affinity of said first semiconductor layer at its surface in contact with said first semiconductor layer and equal to or larger than the electron affinity of said third semiconductor layer at its surface in contact with said third semiconductor layer, and the electron affinity of said fourth semiconductor layer is equal to or smaller than the electron affinity of said third semiconductor layer at its surface in contact with said third semiconductor layer, and said third semiconductor layer includes a first doped layer doped with a carrier of said one conductivity type at a predetermined high concentration and a second doped layer doped with a carrier of said one conductivity type at a predetermined concentration lower than said predetermined high concentration and wherein said first doped layer and said second doped layer are formed of the same semiconductor material having a homojunction with each other, and in said third semiconductor layer the layer closest to said second semiconductor layer comprises said first doped layer.

14. The field effect semiconductor device according to claim 13, wherein said first semiconductor layer is a buffer layer, said second semiconductor layer is a first channel layer in which electrons mainly drift in a low-noise operation, said third semiconductor layer is a carrier-supplying and second channel layer in which electrons mainly drift in a high-power operation, and said fourth semiconductor layer is a barrier layer.

15. The field effect semiconductor device according to claim 13, wherein said first doped layer includes a monolayer formed by the atomic planar doping.

16. The field effect semiconductor device according to claim 13, wherein the sheet carrier concentration of said first doped layer is equal to or smaller than substantially twice the sheet carrier concentration of said second doped layer per 100 Å.

17. The field effect semiconductor device according to claim 13, further comprising an impurity diffusion preventing layer provided between said second semiconductor layer and said third semiconductor layer.

18. The field effect semiconductor device according to claim 13, wherein said fourth semiconductor layer includes a barrier layer having an electron affinity equal to or smaller than that of said third semiconductor layer at its surface in contact with said third semiconductor layer, and a protection layer having an electron affinity equal to or larger than that of said barrier layer at its surface on said barrier layer.

19. The field effect semiconductor device according to claim 13, further comprising, first and second highly conductive regions formed spaced apart from each other in a portion of said device extending from said fourth semiconductor layer at least to said third semiconductor layer, first and second ohmic electrodes formed on said first and second highly conductive regions, respectively, and a Schottky electrode formed on a region between said first and second highly conductive regions.

* * * * *